(12) United States Patent
Besse et al.

(10) Patent No.: US 9,606,159 B2
(45) Date of Patent: Mar. 28, 2017

(54) ELECTRONIC DEVICE AND METHOD FOR MAINTAINING FUNCTIONALITY OF AN INTEGRATED CIRCUIT DURING ELECTRICAL AGGRESSIONS

(75) Inventors: Patrice Besse, Tournefeuille (FR);
Valérie Bernon-Enjalbert, Fonsorbes (FR); Philippe Givelin, Leguevin (FR)

(73) Assignee: NXP USA, Inc., Austin, TX (US)

( * ) Notice: Subject to any disclaimer, the term of this patent is extended or adjusted under 35 U.S.C. 154(b) by 207 days.

(21) Appl. No.: 14/394,792

(22) PCT Filed: Apr. 26, 2012

(86) PCT No.: PCT/IB2012/001066
§ 371 (c)(1),
(2), (4) Date: Oct. 16, 2014

(87) PCT Pub. No.: WO2013/160713
PCT Pub. Date: Oct. 31, 2013

(65) Prior Publication Data
US 2015/0061728 A1    Mar. 5, 2015

(51) Int. Cl.
  *G01R 31/00*    (2006.01)
  *H03K 17/0812*  (2006.01)
  *H03K 17/082*   (2006.01)
  *H01L 27/02*    (2006.01)

(52) U.S. Cl.
  CPC ....... *G01R 31/002* (2013.01); *H03K 17/0822* (2013.01); *H03K 17/08122* (2013.01); *H01L 27/0251* (2013.01)

(58) Field of Classification Search
  CPC ............. G01R 3/002; H03K 17/08122; H03K 17/0822; H01L 27/0251

USPC .......................................................... 361/90
  See application file for complete search history.

(56) References Cited

U.S. PATENT DOCUMENTS

| 5,239,440 A | 8/1993 | Merrill |
| 5,859,756 A * | 1/1999 | Pressman ............... H02H 3/207 361/18 |
| 2004/0027742 A1 | 2/2004 | Miller et al. |
| 2005/0034016 A1 | 2/2005 | Ferrand et al. |
| 2005/0128664 A1* | 6/2005 | Pilling ................... H01L 23/50 361/56 |
| 2006/0256590 A1 | 11/2006 | Yang |

(Continued)

OTHER PUBLICATIONS

International Search Report and Written Opinion correlating to PCT/IB2012/001066 dated Jan. 31, 2013.

*Primary Examiner* — Thienvu Tran
*Assistant Examiner* — Kevin J Comber
(74) *Attorney, Agent, or Firm* — Charlene R. Jacobsen

(57) ABSTRACT

An electronic device for generating an error signal in response to an electrostatic discharge perturbation is described. The device may comprise: a detection unit for generating a detection signal in response to said electrostatic discharge perturbation, said detection signal correlating in time with said electrostatic discharge perturbation; a clock for generating a clock signal having a clock period; and a protection unit for generating an error signal in response to said detection signal only when a duration of said detection signal exceeds a predefined multiple of said clock period. A method of generating an error signal in response to an electrostatic discharge perturbation, for protecting electronic circuitry, is also disclosed.

21 Claims, 3 Drawing Sheets

(56) References Cited

U.S. PATENT DOCUMENTS

2010/0077264 A1 3/2010 Freitas et al.
2010/0157491 A1 6/2010 Hong

* cited by examiner

ELECTRONIC DEVICE AND METHOD FOR MAINTAINING FUNCTIONALITY OF AN INTEGRATED CIRCUIT DURING ELECTRICAL AGGRESSIONS

FIELD OF THE INVENTION

This invention relates to an electronic device and to a method for protecting circuitry during electrostatic discharge.

BACKGROUND OF THE INVENTION

Integrated circuits and other kinds of electronic devices are often sensitive to electromagnetic perturbations that may prevent the circuit or device from operating correctly. Electromagnetic perturbations may originate from a variety of sources. The sources may include manmade sources such as radio transmitters, power switches, alternating current (AC) power lines, and dedicated noise generating devices such as electrostatic discharge (ESD) generators.

It may be desired that a circuit operates normally during and after exposure to electromagnetic perturbations. The robustness of a circuit against electromagnetic perturbations may be tested, for example, using an ESD simulator, also termed ESD gun. Various safety levels (e.g., Asil-D) and robustness levels (e.g., class A IEC 61000-4-2, ISO 10605) are known, for instance, in the automotive domain.

SUMMARY OF THE INVENTION

The present invention provides a device and method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
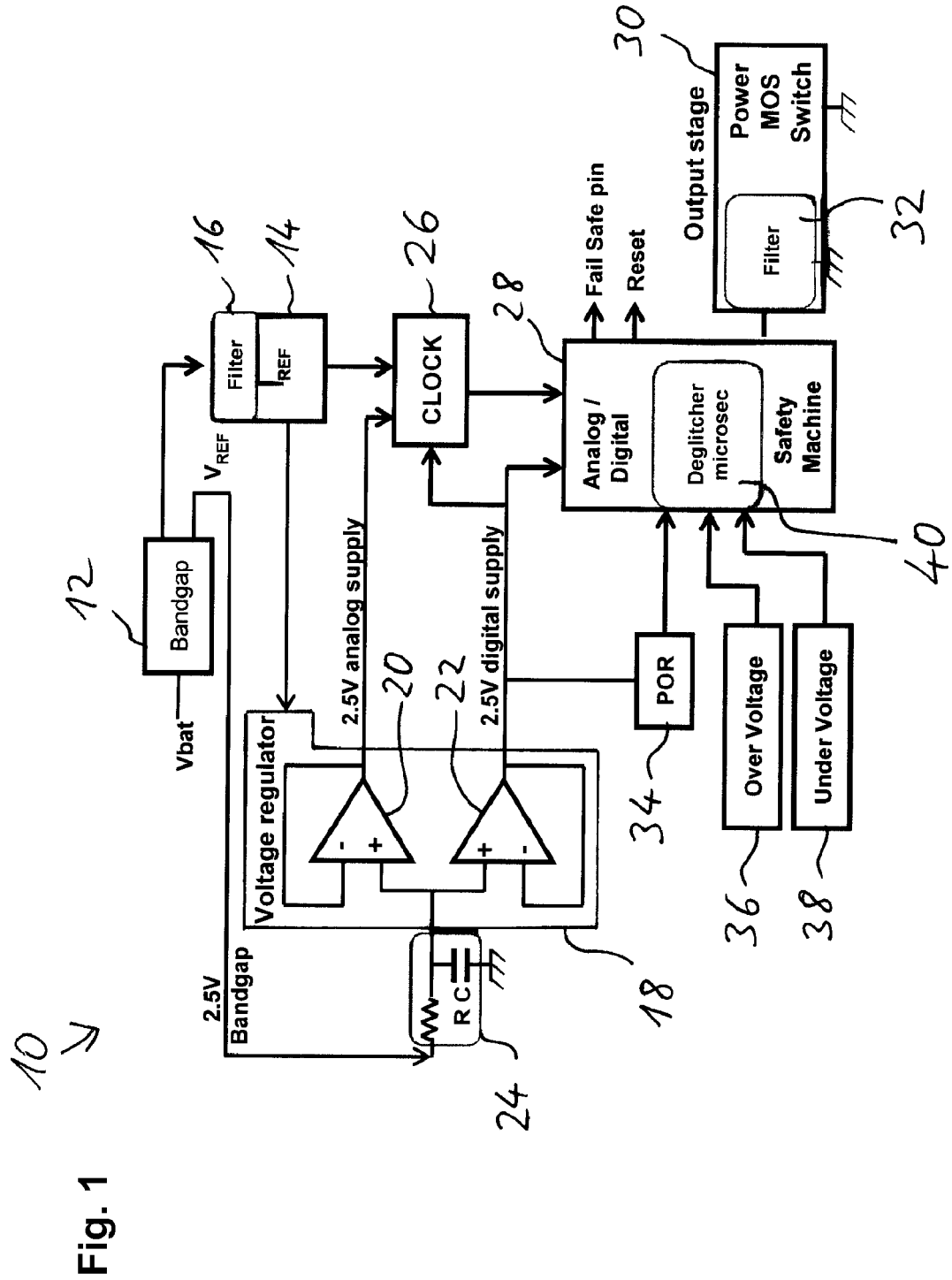
FIG. 1 schematically shows an example of an embodiment of an electronic device for maintaining functionality in response to an electrostatic discharge perturbation.

FIG. 1 shows an electronic device 10 for preventing malfunction during an electrostatic discharge perturbation. An electrostatic discharge perturbation may be any electromagnetic effect that is caused by an electrostatic discharge. The perturbation may, for instance, comprise an abrupt and usually unexpected voltage or current surge within the electronic device 10 or within another device or circuit, for instance, in a circuit connected to the device 10 and arranged to be protected by the electronic device 10.

The device 10 may comprise one or more detection units for generating a detection signal in response to the electrostatic discharge perturbation. The detection signal may correlate in time with the electrostatic discharge perturbation. For instance, the detection signal may have a duration which substantially matches duration of the electrostatic discharge perturbation. In the shown example, the device may comprise, e.g., a first detection unit 34, a second detection unit 36, and a third detection unit 38. The detection units 34, 36, and 38 may, for instance, output respectively a detection signal in response to a power on reset (POR) signal, an overvoltage, and an undervoltage caused or detected in the electronic device 10 or within a connected circuit in the event of an electrostatic discharge disturbance. The device 10 may further comprise a protection unit 28 for generating an error signal in response to the detection signal. A circuit to be protected against the electrostatic discharge perturbation or against any detrimental effects caused by the perturbation may then be arranged to react to the error signal in a suitable manner. The circuit to be protected (also referred to herein as the protected circuit) may, for instance, be arranged to reset in response to the error signal from the protection unit 28 or to be suspended in its current state or to be powered down.

The electronic device 10 may further comprise a clock 26 for generating a clock signal having a clock period. The clock period may be defined as an inverse of the clock rate. In other words, the clock period is the duration of one clock cycle. A clock cycle may be the time interval between e.g. two successive rising or falling edges of the clock signal. The protection unit 28 may be further arranged to generate the error signal only when a duration of the detection signal generated by the one of the detection units 34, 36, 38 exceeds a predefined multiple of the clock period. The protection unit 28 may thus be prevented from issuing an error signal when the detection signal is shorter than the predefined multiple of the clock period. In other words, the protection unit 28 may be arranged to validate the received detection signals depending on their duration. Short detection signals which may be indicative of short electrostatic discharge perturbations may thus be ignored. This may be beneficial, as it has been observed that a circuit may be immune to very short electrostatic discharge perturbations so that it does need to react to any detection signal that correlates to such a short perturbation. For instance, a clocked circuit may be immune to perturbations that are substantially shorter than the clock period.

The device 10 may be arranged to be powered by, e.g., a battery providing a voltage VBAT, or by any other suitable voltage supply. The device 10 may comprise a band gap unit 12 for outputting a reference voltage VREF relative to a ground voltage. The reference voltage VREF may, for instance, have a band gap of, e.g., 2.5 volts relative to ground. In the shown example, the device 10 may further comprise a reference current unit 14 connected to the band gap unit 12 for generating a reference current IREF. A low pass filter 16 may be connected between the band gap unit 12 and the reference current unit 14 for filtering out rapid variations, e.g. surges, of the reference voltage VREF. The reference current unit 14 may thus be immune to electrostatic discharge perturbations. The device 10 may further comprise a voltage regulator 18 connected to the band gap unit 12 and the reference current unit 14 and arranged to output a supply voltage of, e.g., 2.5 volts. In the shown example, the voltage regulator may comprise, for instance, an analog voltage regulator 20 and a digital voltage regulator 22. The analog and digital voltage regulators 20 and 22 may each be arranged to output a supply voltage of, e.g., the same or different amplitude. A low pass filter 24 may be connected between the band gap unit 12 and the voltage regulator 18 so as to make the voltage regulator more robust against ESD perturbations.

As mentioned above, the device 10 may further comprise a clock 26 for generating a clock signal. In the shown example, the clock 26 may be arranged to be powered and controlled by the reference current IREF, the analog supply voltage (output by e.g. the analog voltage regulator 20), and the digital supply voltage (output by e.g. the digital voltage regulator 22).

The protection unit 28 may be connected to the clock 26, the digital voltage regulator 22, and the detection units 34, 36, 38, and may thus be responsive to the clock signal from the clock 26, the supply voltage from the digital voltage regulator 22, and the detection signals from the detection units 34, 36, 38 for example. The protection unit 28 may have one or more output terminals for providing output signals that are not corrupted by ESD perturbation, to other electronic circuits, e.g. to other integrated circuits. In the shown example, the output signal may be provided to, e.g., a fail-safe pin, a reset input or to an output stage 30 connected to the protection unit 28.

In the shown example, the output stage 30 may comprise, e.g., a power switch which is responsive to the error signal from the protection unit 28. The power switch may, for instance, be a transistor, e.g., a field effect transistor or a bipolar transistor. In the shown example, the output stage comprises a power MOS switch having a gate connected to the protection unit 28. The gate may be connected to the protection unit 28 via a low pass filter 32 for filtering out rapid variations, e.g. voltage surges, possibly introduced to the error signal from the protection unit 28.

The filters 16, 24, and 32 may help to ensure that the input reference voltages and currents are stored for a time longer than the ESD perturbation, for instance, longer than one microsecond. The reference currents and voltages may thus ensure that the clock 26 is permanently active.

In the present example, the protection unit 28 may comprise a deglitcher unit 40 for filtering out detection signals having duration of less than said predefined multiple of the clock period. Proper functioning of the deglitcher unit 40 may be ensured by the clock 26 being permanently active. The predefined multiple of the clock period may have a duration of e.g. between 0.2 and 0.5 clock periods. Alternatively or equivalently, it may have a duration of e.g. between 0.1 and 1.0 microseconds. ESD perturbations shorter than e.g. 0.2 or 0.5 clock periods, or shorther than e.g. 0.1 or 1.0 microseconds, may thus be filtered out whereas other ESD perturbations (i.e. ESD perturbations longer than the predefined multiple of the clock period) may trigger an output signal from the protection unit 28 that may e.g. cause a reset of circuitry connected to the protection unit.

The output signals from the protection unit 28 may be further filtered. For instance, the error signal may be output in form of a gate voltage provided to the power MOS switch in the output stage 30. The gate voltage may be stored for, e.g., a few microseconds or at least one microsecond. Furthermore, the gate-to-source voltage may be maintained by a connection of a source of the power MOS switch to a local substrate, for example. Key and crucial analog signals in the device 10 may thus be filtered so as to ensure a safe and clean behavior of the clock 26 and reference voltages. This filtering may be combined with a digital deglitcher, e.g., the deglitcher unit 40, which may reinforce the filtering of the chain against ESD disturbances. The described topology may thus be used to isolate the logic plus power-on-reset plus digital supply plus clock subset. The subset may be isolated from ESD aggression by building a barrier on the potentially weak path from the ESD aggression to the logic and the reset generation. Therefore, the logic may maintain its digital state because both its supply and clock may remain operational. As a consequence, a risk that an ESD event will generate a reset or state machine malfunction may be significantly reduced or even be negligible, as required for the ESD class A specification.

Figure 2:
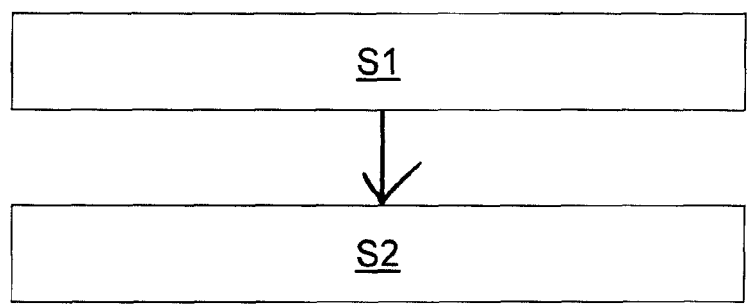
FIG. 2 shows a method for preventing generation of an error signal in response to an electrostatic discharge perturbation.

Referring now to FIG. 2, a method of preventing generation of an error signal in response to an electrostatic discharge perturbation is described. Block S1 may comprise generating a detection signal in response to the electrostatic discharge perturbation. The detection signal may correlate in time with the electrostatic discharge perturbation. Block S2 may comprise generating an error signal in response to the detection signal only if a duration of the detection signal exceeds a predefined multiple of a clock period of a clock signal. Generation of an erroneous error signal, i.e., an error signal in response to an ESD perturbation that is too short to be detrimental, may thus be avoided. In other words, the method may be described as preventing generation of an error signal in response to an ESD perturbation that is shorter than a critical perturbation. The method may also comprise generating the clock signal for the purpose of determining the duration of the electrostatic discharge perturbation.

Figure 3:
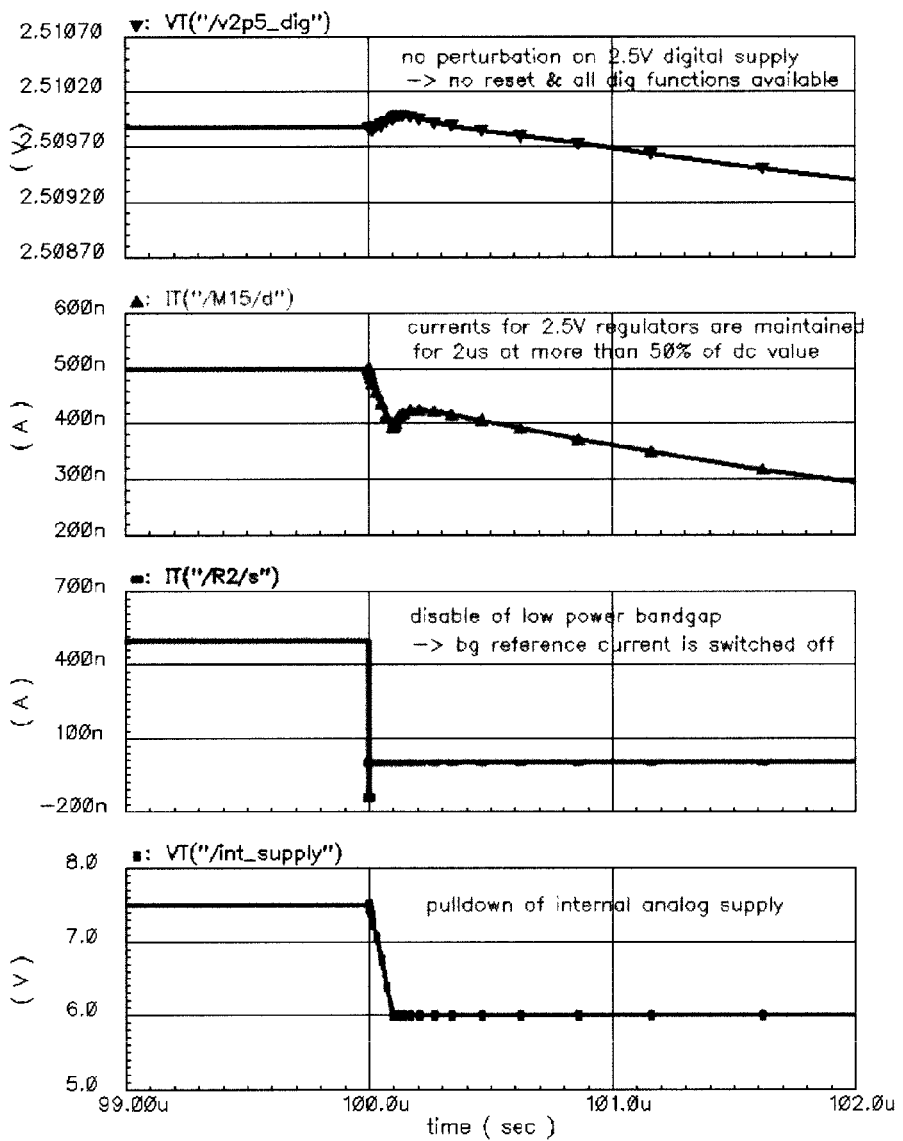
FIG. 3 shows diagrams of electrical voltages and current levels observed in response to electrostatic discharge perturbations.

Referring now to FIG. 3, the plots shown therein illustrate voltage and current values observed with a device as described above in reference to FIG. 1. Plot A illustrates a time dependence of a supply voltage that is output by the digital voltage regulator 22. An ESD is seen to have a very low impact on the digital regulator 22. Plot B illustrates a corresponding time dependence of the reference current IREF received from the reference current unit 14 at the voltage regulator 18. The current is seen to be substantially maintained. At the same time, a band gap current from the band gap unit 12 to the filter 16 is seen to be pulled to zero (plot C), and a supply voltage output by the analog voltage regulator 20 is observed to be pulled down (plot D).

In the foregoing specification, the invention has been described with reference to specific examples of embodiments of the invention. It will, however, be evident that various modifications and changes may be made therein without departing from the broader scope of the invention as set forth in the appended claims, which are not limited to the specific examples described. For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, a permanent clock 26 may be generated by other means than those shown in FIG. 1. Also, the error-signal-generating device 10 may be integrated in the device to be protected. Similarly, the device 10 may comprise the circuitry to be protected by the error signal.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit (IC) or within a same device. For example, the units 34, 36, 38 may form part of an IC comprising the protection unit 28. Alternatively, the examples may be implemented as any number of separate integrated circuits or separate devices interconnected with each other in a suitable manner. For example, the detection units 34, 36, 38 may be external to an IC comprising the protection unit 28 and may be suitably connected to the protection unit 28.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device, comprising:
   a band gap circuit configured to receive a supply voltage and to output a reference voltage having a voltage relative to a ground voltage;
   a reference current circuit coupled to the band gap circuit to receive the reference voltage and configured to generate a reference current;
   a first filter connected between the band gap circuit and the reference current circuit and configured to filter out variations of the reference voltage;
   a voltage regulator coupled to the band gap circuit to receive the reference voltage and configured to generate a supply voltage;
   a second filter connected between the band gap circuit and the voltage regulator;
   a detection circuit configured to generate a detection signal in response to an electrostatic discharge perturbation, the detection signal correlating in time with the electrostatic discharge perturbation;

a clock coupled to the reference current circuit to receive the reference current and coupled to the voltage regulator to receive the supply voltage, and configured to generate a clock signal having a clock period;

a deglitcher circuit; and a protection circuit including the deglitcher circuit and coupled to the clock to receive the clock signal, and configured to generate an error signal in response to the detection signal only when a duration of the detection signal exceeds a predefined multiple of the clock period, wherein the deglitcher circuit filters said detection signal and wherein the multiple is less than 1.

2. The device of claim 1, wherein the detection signal is a power-on reset (POR) signal, an over voltage signal, or an under voltage signal.

3. The device of claim 1, further comprising a third filter coupled to the protection circuit to filter the error signal.

4. The device of claim 1, wherein the voltage regulator comprises an analog voltage regulator configured to provide an analog reference voltage to the clock.

5. The device of claim 1, wherein the voltage regulator comprises a digital voltage regulator configured to provide a digital reference voltage to the clock.

6. The device of claim 1, wherein the multiple of said clock period is between 0.2 and 0.5 clock periods.

7. The device of claim 1, wherein the multiple of said clock period is between 0.1 and 1.0 microseconds.

8. The device of claim 1, comprising an output stage connected to the protection circuit and responsive to the error signal.

9. The device of claim 8, wherein the output stage comprises a power switch.

10. A method for protecting electronic circuitry, comprising:

filtering a reference voltage with a set of filters to provide a filtered reference voltage;

generating a reference current with the filtered reference voltage at a reference current unit;

generating a supply voltage with the filtered reference voltage at a voltage regulator;

generating a detection signal in response to an electrostatic discharge perturbation, the detection signal correlating in time with the electrostatic discharge perturbation;

operating a clock with the supply voltage and the reference current;

generating a clock signal having a clock period with the clock;

generating an error signal in response to the detection signal only when a duration of the detection signal exceeds a predefined multiple of said clock period, wherein the multiple is less than 1.

11. The method of claim 10, wherein the detection signal is a power-on reset (POR) signal, an over voltage signal, or an under voltage signal.

12. The method of claim 10, further comprising filtering the error signal with a third filter.

13. The method of claim 10, wherein the multiple of the clock period is between 0.2 and 0.5 clock periods.

14. The method of claim 10, wherein the multiple of the clock period is between 0.1 and 1.0 microseconds.

15. An electronic device, comprising:

a set of filters including a first filter, a second filter, and a third filter;

a reference current circuit coupled to receive a first reference voltage and configured to generate a reference current, wherein the first filter filters the first reference voltage to provide a filtered first reference voltage to the reference current unit;

a voltage regulator coupled to receive a second reference voltage and configured to generate a supply voltage, wherein the second filter filters the second reference voltage to provide a filtered second reference voltage to the voltage regulator;

a detection circuit configured to generate a detection signal in response to an electrostatic discharge perturbation, the detection signal correlating in time with the electrostatic discharge perturbation;

a clock coupled to the reference current circuit to receive the reference current and coupled to the voltage regulator to receive the supply voltage, and configured to generate a clock signal having a clock period;

a deglitcher circuit;

a protection circuit including the deglitcher circuit and coupled to the clock to receive the clock signal, and configured to generate an error signal in response to the detection signal only when a duration of the detection signal exceeds a predefined multiple of said clock period, wherein the deglitcher circuit filters said detection signal and wherein the multiple is less than 1; and a power switch coupled to said protection circuit to receive the error signal and responsive to said error signal, wherein the third filter is connected between the protection circuit and the power switch to filter the error signal.

16. The device of claim 15, wherein the detection signal is a power-on reset (POR) signal, an over voltage signal, or an under voltage signal.

17. The device of claim 15, wherein the voltage regulator comprises an analog voltage regulator configured to provide an analog reference voltage to the clock.

18. The device of claim 15, wherein the voltage regulator comprises a digital voltage regulator configured to provide a digital reference voltage to the clock.

19. The device of claim 15, wherein the first filter is a low pass filter.

20. The device of claim 15, wherein the second filter is a low pass filter.

21. An electronic device, comprising:

a band gap circuit configured to receive a supply voltage and to output a reference voltage having a voltage relative to a ground voltage;

a reference current circuit coupled to the band gap circuit to receive the reference voltage and configured to generate a reference current;

a first filter connected between the band gap circuit and the reference current circuit and configured to filter out variations of the reference voltage;

a voltage regulator coupled to the band gap circuit to receive the reference voltage and configured to generate a supply voltage;

a second filter connected between the band gap circuit and the voltage regulator;

a detection circuit configured to generate a detection signal in response to an electrostatic discharge perturbation, the detection signal correlating in time with the electrostatic discharge perturbation;

a clock coupled to the reference current circuit to receive the reference current and coupled to the voltage regulator to receive the supply voltage, and configured to generate a clock signal having a clock period;

a deglitcher circuit; and a protection circuit including the deglitcher circuit and coupled to the clock to receive the clock signal, and configured to generate an error signal in response to the detection signal only when a duration of the detection signal exceeds a predefined multiple of the clock period, wherein the deglitcher circuit filters said detection signal and wherein the multiple is greater than or equal to 1.

* * * * *